(12) United States Patent
Bando et al.

(10) Patent No.: US 8,541,292 B2
(45) Date of Patent: Sep. 24, 2013

(54) GROUP III NITRIDE SEMICONDUCTOR EPITAXIAL SUBSTRATE AND METHOD FOR MANUFACTURING THE SAME

(75) Inventors: Akira Bando, Hiki-gun (JP); Hiroshi Amano, Nagoya (JP)

(73) Assignee: Showa Denko K.K., Tokyo (JP)

( * ) Notice: Subject to any disclaimer, the term of this patent is extended or adjusted under 35 U.S.C. 154(b) by 21 days.

(21) Appl. No.: 12/866,147

(22) PCT Filed: Jan. 28, 2009

(86) PCT No.: PCT/JP2009/051347
§ 371 (c)(1),
(2), (4) Date: Aug. 4, 2010

(87) PCT Pub. No.: WO2009/098979
PCT Pub. Date: Aug. 13, 2009

(65) Prior Publication Data
US 2010/0327228 A1   Dec. 30, 2010

(30) Foreign Application Priority Data
Feb. 8, 2008   (JP) .................................. 2008-029456

(51) Int. Cl.
*H01L 21/20* (2006.01)
(52) U.S. Cl.
USPC .... 438/478; 438/341; 438/481; 257/E21.566; 257/E21.117; 257/E21.126; 257/E21.115
(58) Field of Classification Search
USPC ................. 438/478, 341, 481; 257/E21.566, 257/E21.117, E21.126, E21.115
See application file for complete search history.

(56) References Cited

U.S. PATENT DOCUMENTS

2003/0198301 A1* 10/2003 Terashima et al. ............ 375/316
2007/0215033 A1*  9/2007 Imaeda et al. .................. 117/13

FOREIGN PATENT DOCUMENTS

| JP | 57-500670 A | 4/1982 |
| JP | 11-251632 A | 9/1999 |
| JP | 2007-254161 A | 10/2007 |
| JP | 2007-297223 A | 11/2007 |
| WO | 81/02948 A1 | 10/1981 |

OTHER PUBLICATIONS

Japanese Office Action issued in Application No. 2008-029456 dated Mar. 5, 2013.

* cited by examiner

Primary Examiner — Julio J. Maldonado
Assistant Examiner — Hajar Kolahdouzan
(74) Attorney, Agent, or Firm — Sughrue Mion, PLLC (57) ABSTRACT

There is provided a group III nitride semiconductor epitaxial substrate which has a suppressed level of threading dislocation in the vertical direction and excellent crystal quality, the group III nitride semiconductor epitaxial substrate including a substrate (1) for growing an epitaxial film; and an ELO layer (4) having a composition of $Al_xGa_{1-x}N$ ($0 \le x \le 1$) formed either on top of the substrate (1) or on top of a group III nitride layer (2) formed on top of the substrate (1), wherein the ELO layer (4) is a layer formed by using a mask pattern (3), which is composed of carbon and is formed either on top of the substrate (1) or on top of the group III nitride layer (2).

7 Claims, 4 Drawing Sheets

PRIOR ART

GROUP III NITRIDE SEMICONDUCTOR EPITAXIAL SUBSTRATE AND METHOD FOR MANUFACTURING THE SAME

TECHNICAL FIELD

The present invention relates to a group III nitride semiconductor epitaxial substrate and an improved method for manufacturing the same.

Priority is claimed on Japanese Patent Application No. 2008-029456, filed Feb. 8, 2008, the content of which is incorporated herein by reference.

BACKGROUND ART

Applications of group III nitride semiconductor devices and in particular, devices for emitting or receiving light having a wavelength of 360 nm or less in the ultraviolet or deep ultraviolet region which use $Al_xGa_{1-x}N$ (0<x≤1) substrates have been anticipated for some time in the field of medical treatments or precision machining.

With respect to such devices for emitting or receiving light in the ultraviolet or deep ultraviolet region, in those cases where either a template substrate in which a GaN layer is laminated on top of a substrate composed of a single crystal of different kinds such as sapphire or SiC, or an independent GaN substrate is used in a conventional manner, light emitted from a light emitting layer is absorbed by the GaN layer, which is a problem.

Further, in those cases where an AlGaN layer having a high ratio of Al composition is deposited on a GaN layer, cracks are formed due to the differences in the lattice constant and the coefficient of thermal expansion, thereby causing deterioration in the device characteristics.

In order to solve these problems, it is necessary to eliminate the light absorption and to enhance the efficiency for emitting or receiving light by using an AlGaN substrate having an adequate composition for transmitting light with a wavelength which can be emitted or received by the devices. At the same time, it is necessary to suppress the occurrence of cracks or dislocations and to improve the crystal quality by reducing the differences in the lattice constant and the coefficient of thermal expansion between the light-emitting and receiving layers. However, the quality of $Al_xGa_{1-x}N$ (0<x≤1) crystals achieved to date has not been satisfactory. Since an $Al_xGa_{1-x}N$ (0<x≤1) crystal having a particularly high molar fraction of AlN exhibits characteristics that are close to those of AlN such as a high melting point and a low vapor pressure as compared to a GaN crystal, it has been difficult to achieve a satisfactory level of crystal growth.

Incidentally, as a document disclosing a method for manufacturing a GaN substrate formed by an epitaxial lateral overgrowth (ELO) process in order to improve the crystallinity, for example, the following Patent Document 1 is known.

That is, according to Patent Document 1, there is disclosed a method for manufacturing a GaN-based semiconductor element in which a first GaN-based semiconductor layer is formed on top of a sapphire substrate, followed by formation of a mask pattern composed of a silicon oxide film ($SiO_2$) or a silicon nitride film (SiN) on top of this first GaN-based semiconductor layer, and a second GaN-based semiconductor layer is then formed by the ELO process using the mask pattern. As a result, according to the disclosure, a GaN-based semiconductor layer in which the threading dislocation in the vertical direction is suppressed can be achieved.

Figure 4:
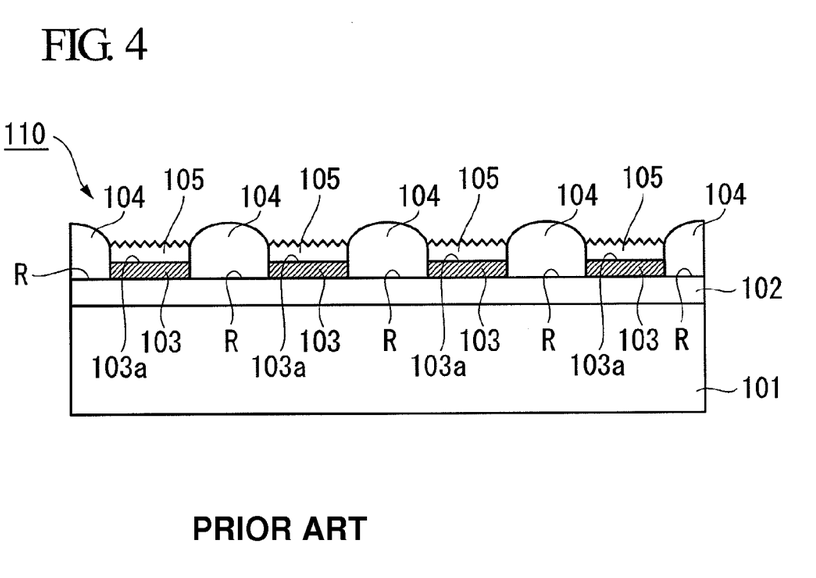
FIG. 4 is a schematic cross sectional view showing a configuration for a group III nitride semiconductor epitaxial substrate prepared by a conventional technique.
Figure 5:
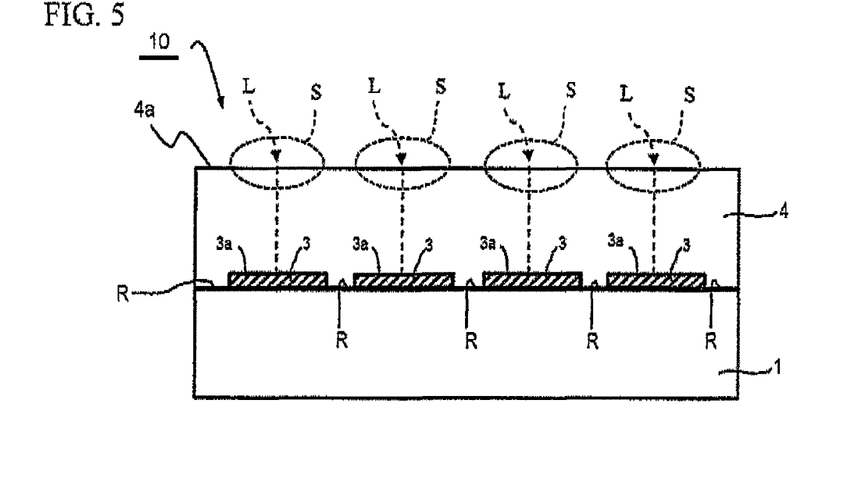
FIG. 5 is schematic cross sectional view showing a configuration for a group III nitride semiconductor epitaxial substrate, which is an embodiment according to the present invention.

Although it may be possible to employ the ELO process to improve the crystal quality of $Al_xGa_{1-x}N$ (0<x≤1), when an AlN-based semiconductor layer is formed by the conventional ELO process, the following problems arise. That is, as shown in FIG. 4, an AlN semiconductor layer 102 serving as a group III nitride layer is formed on top of a sapphire substrate 101, followed by formation of a mask pattern 103 composed of a silicon oxide film ($SiO_2$) or a silicon nitride film (SiN) on top of this AlN semiconductor layer 102, and ELO layers 104 composed of $Al_xGa_{1-x}N$ (0<x≤1) are grown by the ELO process using the mask pattern 103 from regions R that are not covered by the mask pattern 103.

Here, in those cases where the ELO layer 104 is composed of a GaN-based semiconductor layer as in the case disclosed in Patent Document 1, since a GaN crystal does not grow on top of the mask pattern 103 composed of a silicon oxide film ($SiO_2$) or a silicon nitride film (SiN), a GaN layer grown from the region R that is not covered by the mask pattern 103 is grown above the mask pattern 103 in the transverse direction. Accordingly, since crystal defects are prevalent in the growth direction, it is thought that the threading dislocation in the vertical direction is suppressed above the mask pattern 103.

However, when those compositions that include Al as a component such as $Al_xGa_{1-x}N$ (0<x≤1) are grown by the ELO process, because a polycrystal 105 is grown on an upper surface 103a of the mask pattern 103 composed of a silicon oxide film ($SiO_2$) or a silicon nitride film (SiN), the ELO layer 104 cannot grow above the mask pattern 103 in the transverse direction. As a result, the threading dislocation in the vertical direction cannot be suppressed, making it impossible to improve the quality of an $Al_xGa_{1-x}N$ (0<x≤1) crystal by employing the ELO process.

[Patent Document 1] Japanese Unexamined Patent Application, First Publication No. Hei 11-251632

DISCLOSURE OF INVENTION

Problems to be Solved by the Invention

The present invention is made in order to solve the above-mentioned problems, with an object of providing a group III nitride semiconductor epitaxial substrate in which the threading dislocation in the vertical direction is suppressed and the crystal quality is excellent, and a method for manufacturing the same.

Means for Solving the Problems

In order to solve the above-mentioned problems, the present inventors undertook extensive and intensive research to discover the following and complete the present invention. That is, by using a mask pattern composed of carbon as a mask pattern other than the mask pattern composed of a silicon oxide film ($SiO_2$) or a silicon nitride film (SiN) used in the ELO process, even if an ELO layer is composed of GaN or composed of $Al_xGa_{1-x}N$ (0<x≤1) including Al, the layer can be grown in the transverse direction on the mask pattern composed of carbon, without the growth of a polycrystal on the mask pattern.

That is, the present invention relates to the following aspects.

[1] A group III nitride semiconductor epitaxial substrate including a substrate for growing an epitaxial film, and an ELO layer having a composition of $Al_xGa_{1-x}N$ (0≤x≤1) formed either on top of the substrate or on top of a group III nitride layer formed on top of the substrate, and characterized in that the ELO layer is a layer formed by using a mask pattern, which is composed of carbon and is formed either on top of the substrate or on top of the group III nitride layer.

[2] A group III nitride semiconductor epitaxial substrate including a substrate for growing an epitaxial film; and an ELO layer having a composition of $Al_xGa_{1-x}N$ (0<x≤1) formed either on top of the substrate or on top of a group III nitride layer formed on top of the substrate; and characterized in that the ELO layer is a layer formed by using a mask pattern, which is composed of carbon and is formed either on top of the substrate or on top of the group III nitride layer.

[3] The group III nitride semiconductor epitaxial substrate according to the above aspect [1] or [2], characterized in that the mask pattern is present between the substrate or the group III nitride layer and the ELO layer.

[4] The group III nitride semiconductor epitaxial substrate according to the above aspect [1] or [2], characterized in that the mask pattern is absent between the substrate or the group III nitride layer and the ELO layer.

[5] A method for manufacturing a group III nitride semiconductor epitaxial substrate characterized by including a step for forming a mask pattern composed of carbon on top of a substrate for growing an epitaxial film or on top of a group III nitride layer formed on top of the substrate; and a step for forming an ELO layer having a composition of $Al_xGa_{1-x}N$ (0≤x≤1) by using the mask pattern.

[6] A method for manufacturing a group III nitride semiconductor epitaxial substrate characterized by including a step for forming a mask pattern composed of carbon on top of a substrate for growing an epitaxial film or on top of a group III nitride layer formed on top of the substrate; and a step for forming an ELO layer having a composition of $Al_xGa_{1-x}N$ (0<x≤1) by using the mask pattern.

Effects of the Invention

As described above, according to the group III nitride semiconductor epitaxial substrate and the manufacturing method thereof of the present invention, a group III nitride semiconductor epitaxial substrate in which the threading dislocation in the vertical direction is suppressed and the crystal quality is excellent, and a method for manufacturing the same can be provided.

DESCRIPTION OF THE REFERENCE SYMBOLS

1: Substrate (substrate for growing an epitaxial film)
2: Group III nitride layer
3: Mask pattern
3A: Carbon film
3a: Upper surface of mask pattern
4: ELO layer
4A: Crystal having a composition of $Al_xGa_{1-x}N$ (0<x≤1)
4a: Surface of an ELO layer
L: Association line
R: Region not covered by mask pattern
S: Region with low crystal dislocation density

BEST MODE FOR CARRYING OUT THE INVENTION

An embodiment of a group III nitride semiconductor epitaxial substrate according to the present invention will be described below with appropriate reference to the drawings.

Figure 1:
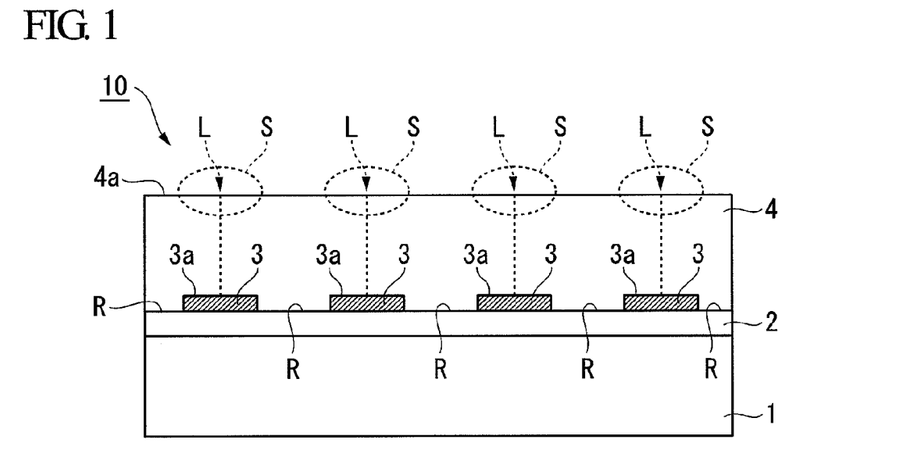
FIG. 1 is a schematic cross sectional view showing a configuration for a group III nitride semiconductor epitaxial substrate, which is an embodiment according to the present invention.
Figure 2A:
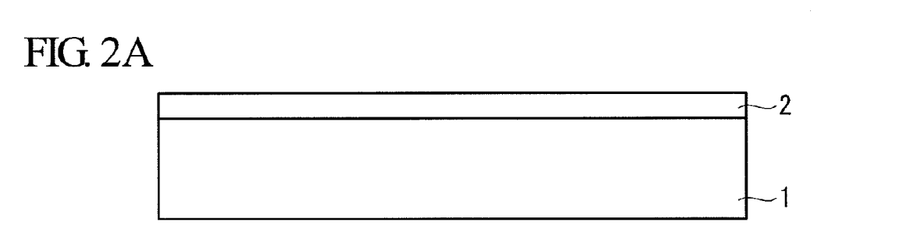
FIGS. 2A to 2C are schematic cross sectional view showing a method for manufacturing a group III nitride semiconductor epitaxial substrate.
Figure 2B:
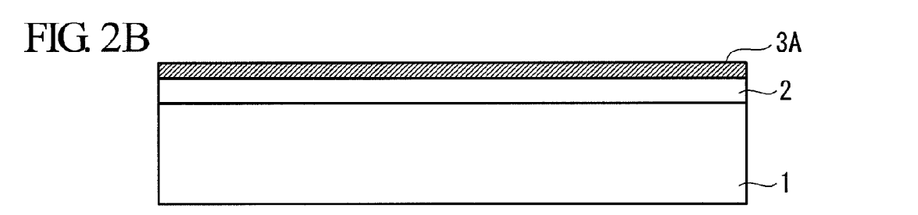
Figure 2C:
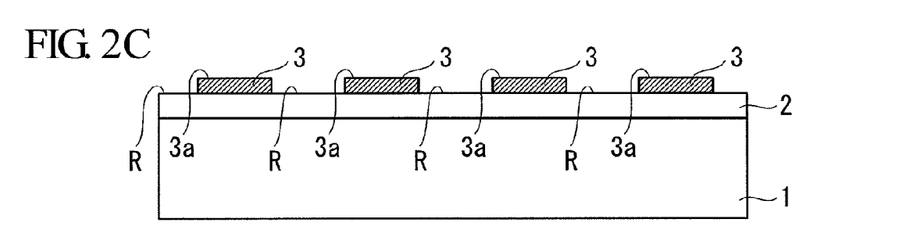
Figure 3A:
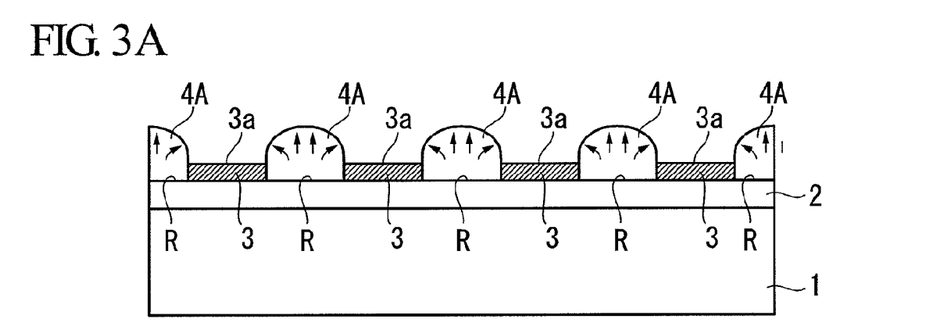
FIGS. 3A to 3C are schematic cross sectional view showing a method for manufacturing a group III nitride semiconductor epitaxial substrate.
Figure 3B:
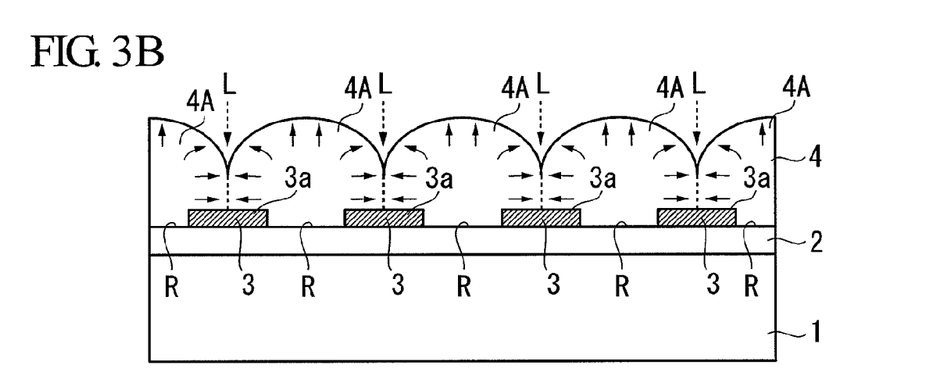
Figure 3C:
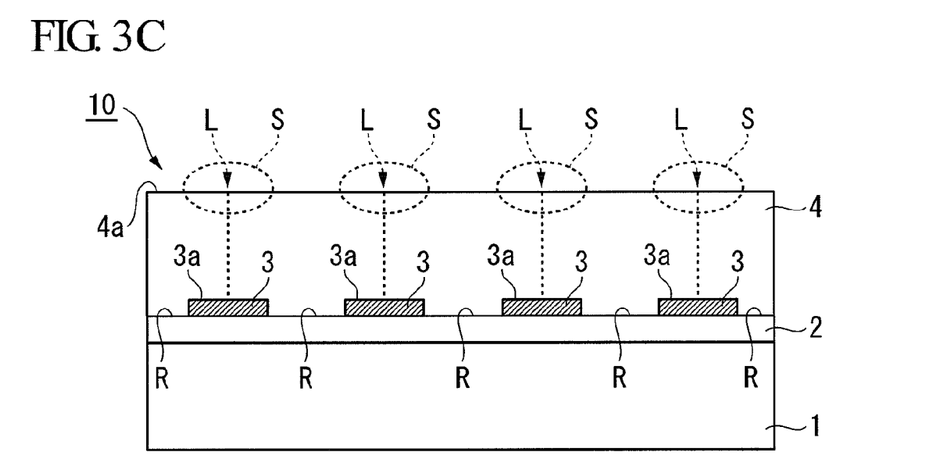

FIG. 1 is a schematic cross sectional view showing a configuration for a group III nitride semiconductor epitaxial substrate, which is an embodiment according to the present invention. In addition, FIG. 2 and FIG. 3 are schematic cross sectional views showing a method for manufacturing a group III nitride semiconductor epitaxial substrate. It should be noted that FIGS. 1 to 3 below are for describing a configuration of the embodiments according to the present invention, and size, thickness and dimensions of each portion illustrated may differ from the dimensional relationship of each portion in the actual group III nitride semiconductor epitaxial substrate.

As shown in FIG. 1, a group III nitride semiconductor epitaxial substrate 10 is mainly constituted of a substrate 1, a group III nitride layer 2 formed on top of this substrate 1 by lamination, a mask pattern 3 formed on top of the group III nitride layer 2, and an ELO layer 4 having a composition of $Al_xGa_{1-x}N$ (0<x≤1) and formed by lamination on top of the mask pattern 3 and on top of a region R in the group III nitride layer 2 which is not covered by the mask pattern 3.

First, the constitution of each component of the group III nitride semiconductor epitaxial substrate 10 will be described below.

There is no particular limitation on the substrate 1 as long as it can be used as a substrate for growing an epitaxial film. For the substrate 1, substrates made of oxide single crystal materials having relatively high melting points and which are heat resistant such as sapphire (α-$Al_2O_3$ single crystal), zinc oxide (ZnO), and gallium oxide (compositional formula: $Ga_2O_3$), and group IV semiconductor single crystals such as a silicon single crystal (silicon) and cubic or hexagonal silicon carbide (SiC) can be used.

The group III nitride layer 2 is formed on top of the substrate 1 by lamination. In addition, the group III nitride layer 2 has a composition of $Al_yGa_{1-y}N$ (0<y≤1), and although there is no particular limitation, it is preferable that x≤y, in terms of the relationship with the ELO layer 4 having a composition of $Al_xGa_{1-x}N$ (0<x≤1) described later. Further, although there is no particular limitation on the film thickness of the group III nitride layer 2, the thickness is preferably within the range from 0.1 μm to 5 μm, and more preferably within the range from 1 μm to 2 μm. When the film thickness is less than 0.1 μm, it is undesirable since the crystal quality is inadequate, and thus the crystal quality in the regions R where the crystal starts to grow deteriorates and the crystal growth afterwards in the transverse direction is also adversely affected. On the other hand, when the film thickness exceeds 5 μm, it is undesirable because cracks and warpage are readily developed and the surface flatness or the like is also readily deteriorated. In contrast, when the film thickness is within the above-mentioned range, crystals with excellent quality can be obtained and the occurrence of cracks and warpage is also unlikely, which is preferable.

The mask pattern 3 is formed by patterning a carbon film laminated on top of the group III nitride layer 2. For the carbon film, for example, graphite, diamond, diamond like carbon (DLC), carbon nanotubes (CNT), fullerene or the like can be applied. However, materials for the carbon film are not limited to these materials, and any material may be used as long as it can form a dense film on top of the group III nitride layer 2.

Although there is no particular limitation on the film thickness of the mask pattern 3, the thickness is preferably within the range from 10 nm to 200 nm, and more preferably within the range from 50 nm to 100 nm. Note that since the crystal growth in the transverse direction of the ELO layer 4 to be describe later having a composition of $Al_xGa_{1-x}N$ ($0<x\leq1$) is slow as compared to that of a GaN layer, it is preferable that the film thickness of the mask pattern 3 be thin.

As shown in FIG. 1, the pattern shape of the mask pattern 3 is not particularly limited as long as the surface 4a of the ELO layer 4 can be made flat. In addition, any shape including a stripe shape, an island shape or a lattice shape can be adopted for the shape of the mask pattern 3.

The ELO layer 4 has a composition of $Al_xGa_{1-x}N$ ($0<x\leq1$) and is formed by lamination on top of the group III nitride layer 2. In other words, as shown in FIG. 1, the ELO layer 4 is formed by lamination either on top of the upper surface 3a of the mask pattern 3 or on top of the region R corresponding to the upper surface of the group III nitride layer 2 which is not covered by the mask pattern 3. In the present embodiment, since the ELO layer 4 is formed using the mask pattern 3 composed of carbon, even though the ELO layer 4 has a composition of $Al_xGa_{1-x}N$ ($0<x\leq1$), it is possible to form an excellent ELO layer 4 in which an $Al_xGa_{1-x}N$ ($0<x\leq1$) crystal has grown satisfactorily on top of the mask pattern 3 in the transverse direction and also the surface 4a is made flat, without the growth of a polycrystal on top of the mask pattern 3.

In addition, although there is no particular limitation on the film thickness of the ELO layer 4 as long as the layer has a thickness necessary to make the surface 4a of the ELO layer 4 flat, the thickness is preferably within the range from 2 μm to 50 μm, and more preferably within the range from 5 μm to 20 μm. When the film thickness is less than 2 μm, it is undesirable since a mask commonly used in the ELO process having a thickness of several micrometers to several tens of micrometers cannot be covered fully. On the other hand, when the film thickness exceeds 50 μm, it is undesirable because the film thickness following the covering of the mask becomes large, thereby deteriorating the flatness of the surface 4a. In contrast, when the film thickness is within the above-mentioned range, it is preferable since the surface 4a of the ELO layer 4 becomes flat.

As shown in FIG. 1, in the surface 4a of the ELO layer 4, regions S where the crystal dislocation density is low and regions where the crystal dislocation density is high are alternately arranged with a predetermined interval that corresponds to the shape of the mask pattern 3. In addition, association lines L are formed in the above-mentioned regions S. In other words, in the crystal growth using the ELO process, since an $Al_xGa_{1-x}N$ ($0<x\leq1$) crystal does not grow on top of the upper surface 3a of the mask pattern 3 composed of carbon, an $Al_xGa_{1-x}N$ ($0<x\leq1$) crystal grown from the region R in the group III nitride layer 2 which is not covered by the mask pattern 3 is grown in the transverse direction in the upper surface 3a of the mask pattern 3. As a result, in the surface 4a of the ELO layer 4, regions S can be formed in which the threading dislocation in the vertical direction is suppressed. Note that in the initial stage of the crystal growth by the aforementioned ELO process, since the crystal growth in the transverse direction is not adequate, partial gaps (voids) may be formed at times in the vicinity of the association lines L described later, above the upper surface 3a of the mask pattern 3. However, even when the ELO layer 4 is grown together with these gaps, these gaps disappear as the crystal grows further. For this reason, in the ELO layer 4 in which the crystal has grown satisfactorily, there is no gap present in the vicinity of the surface 4a.

As shown in FIG. 1, the regions S where the crystal dislocation density is low are formed within the surface 4a of the ELO layer 4, which is above the upper surface 3a of the mask pattern in the vertical direction. In other words, the regions S where the crystal dislocation density is low are formed at positions so as to oppose the upper surface 3a of the mask pattern 3 with the ELO layer 4 interposed therebetween. Since no threading dislocation in the vertical direction is formed in the regions S, the crystal dislocation density therein is low. This is because the crystal defects are prevalent in the transverse direction since the ELO layer 4 growing from the opposing regions R with the mask pattern 3 interposed therebetween grows in the transverse direction above the upper surface 3a in the vertical direction. In other words, when the crystal is grown epitaxially, since the crystal defects are prevalent in the growth direction of the crystal, dislocations do not propagate in the vertical direction above the mask pattern 3. As a result, the regions S are formed as regions having a low crystal dislocation density.

Further, the association lines L appear in the above-mentioned regions S. As mentioned above, since the ELO layer 4 growing from the opposing regions R with the mask pattern 3 interposed therebetween grows in the transverse direction above the upper surface 3a in the vertical direction, these association lines L appear in the regions S as the boundary lines between the adjacent ELO layers 4.

On the other hand, regions where the crystal dislocation density is high are formed within the surface 4a of the ELO layer 4, which is above the regions R, in the vertical direction, in the group III nitride layer 2 which is not covered by the mask pattern 3.

In other words, the regions where the crystal dislocation density is high are formed at positions so as to oppose the regions R with the ELO layer 4 interposed therebetween. The threading dislocations in the vertical direction are formed in the regions where the crystal dislocation density is high. This is because the crystal defects are prevalent in the vertical direction to form threading dislocations, since the ELO layer 4 grows in the vertical direction above the regions R in the vertical direction.

Next, a method for manufacturing the group III nitride semiconductor epitaxial substrate 10 will be described. The method for manufacturing the group III nitride semiconductor epitaxial substrate 10 is mainly constituted of a step for forming a mask pattern (mask pattern forming step) and a step for forming an ELO layer (ELO layer forming step). Each step will be described below.

<Mask Pattern Forming Step>

In the mask pattern forming step, as shown in FIG. 2A, the group III nitride layer 2 is first formed by lamination on top of the substrate 1. There is no particular limitation on the method for forming the group III nitride layer 2, and, for example, general purpose methods for growing crystals such as a hydride vapor phase epitaxy (HVPE) method and a metal organic chemical vapor deposition (MOCVD) method can be applied.

Next, as shown in FIG. 2B, a carbon film 3A is formed by lamination on top of the group III nitride layer 2. There is no particular limitation on the method for forming the carbon film 3A, and, for example, general purpose methods including CVD methods such as an MOCVD method, sputtering methods, and vapor deposition methods such as an ion beam vapor deposition method, a plasma decomposition deposition method, and a thermal decomposition method can be applied.

Then, as shown in FIG. 2C, a mask pattern 3 is formed by patterning the carbon film 3A. There is no particular limitation on the method for patterning the carbon film 3A, and general purpose photolithography techniques can be applied. For example, a resist layer is first formed on top of the carbon film 3A, and this resist layer is developed by an exposure process to form a predetermined shape. Subsequently, by subjecting the carbon film 3A to an ashing treatment while using the resist layer as a mask, the carbon film 3A is patterned. Finally, the resist layer is removed by a general purpose method. In this manner, the mask pattern 3 composed of carbon is formed on top of the group III nitride layer 2.

<ELO Layer Forming Step>

In the ELO layer forming step, the ELO layer 4 is formed by lamination by epitaxially growing a crystal having a composition of $Al_xGa_{1-x}N$ ($0<x\leq1$) on top of the group III nitride layer 2. There is no particular limitation on the method for epitaxially growing crystals, and, for example, vapor phase growth methods such as a metal organic vapor phase epitaxy (abbreviated as MOVPE, MOCVD or OMVPE) method, a molecular beam epitaxy (MBE) method, and a hydride vapor phase epitaxy (HVPE) method can be applied. In addition, if the use is limited to the AlN crystals, sublimation methods or liquid phase growth methods can also be applied. Note that among these methods mentioned above, it is preferable to apply the MOVPE method.

Vapor phase growth methods are preferable since it is easy to prepare an AlGaN mixed crystal as compared to the liquid phase methods. Furthermore, the MOVPE method is preferable since control of the crystal composition is easy as compared to the HVPE method, and high growth rate can be achieved as compared to the MBE method.

In the case of an MOVPE method, hydrogen ($H_2$) or nitrogen ($N_2$) can be used as the carrier gas, and trimethyl gallium (TMG) or triethyl gallium (TEG) can be used as the Ga source that represents the group III raw material, trimethyl aluminum (TMA) or triethyl aluminum (TEA) can be used as the Al source, and ammonia ($NH_3$) or hydrazine ($N_2H_4$) can be used as the nitrogen source.

In the MOVPE method, the crystal having a composition of $Al_xGa_{1-x}N$ ($0<x\leq1$) is preferably grown at a temperature range of 1,250° C. or higher. This is because when the growth temperature is less than 1,250° C., with respect to the $Al_xGa_{1-x}N$ ($0<x\leq1$) crystal having a high Al composition, the crystal quality deteriorates.

A temperature of 1,250° C. or higher is adequate for the growth temperature in the MOVPE method, and the temperature is preferably 1,300° C. or higher, more preferably 1,400° C. or higher. When the growth temperature is 1,250° C. or higher, it is preferable not only because the temperature is expected to be close to the optimum temperature for growing crystals of AlN, which is a substance having a high melting point and a low vapor pressure, but also because the decomposition and reaction of ammonia is further promoted and the surface migration of Al is also promoted.

In addition, the growth rate in the MOVPE method is preferably 0.1 μm/hr or higher, more preferably 1 μm/hr or higher, and still more preferably 2 μm/hr or higher, in order to improve the productivity.

In the present embodiment, as shown in FIG. 3A, a crystal 4A having a composition of $Al_xGa_{1-x}N$ ($0<x\leq1$) is first epitaxially grown on top of the regions R in the group III nitride layer 2 which is not covered by the mask pattern 3. Here, in the initial phase of the crystal growth, within a range where the height (thickness) of the crystal 4A does not exceed the height (thickness) of the mask pattern 3, the growth direction of the crystal 4A is upward in the vertical direction with respect to the regions R. In addition, since the crystal dislocations (crystal defects) propagate in the crystal growth direction during the epitaxial growth, the direction of the crystal dislocations is also directed upward in the vertical direction with respect to the regions R. When the crystal further grows and the height of the crystal 4A exceeds the height of the mask pattern 3, as shown in FIG. 3A, portions of the crystal 4A adjacent to the mask pattern 3 start to grow in the transverse direction (lateral growth) on the upper surface 3a of the mask pattern 3. Note that the arrows in the drawing indicate the growth direction of the crystal 4A and the propagation direction of the crystal dislocations.

As the crystal 4A further grows, as shown in FIG. 3B, the adjacent crystals 4A with the mask pattern 3 interposed therebetween meet and join on the mask pattern 3 and integrated, thereby forming the ELO layer 4. At this stage, the direction of crystal dislocations on the mask pattern 3 is directed in the transverse direction, as shown by the arrows depicted in FIG. 3B, so that the crystal dislocation oppose to each other. As a result, no threading dislocations in the vertical direction are formed on the mask pattern 3.

In addition, the association lines L are formed as the boundary lines between the adjacent crystals 4A on the mask pattern 3. Note that in the initial stage of the crystal growth by the aforementioned ELO process, that is, from the process depicted in FIG. 3A to the process depicted in FIG. 3B, since the growth of the crystal 4A in the transverse direction is not adequate, partial gaps (voids) may be formed at times in the vicinity of the association lines L above the upper surface 3a of the mask pattern 3. However, even when the ELO layer 4 is grown together with these gaps, these gaps disappear at a stage where the crystal has grown further, that is, in the final phase of the process depicted in FIG. 3B. For this reason, in the ELO layer 4 in which the crystal has grown satisfactorily, there is no gap present in the vicinity of the surface 4a.

In addition, as shown in FIG. 3C, the ELO layer 4 further grows and the surface 4a thereof becomes flat. In this manner, the ELO layer 4 that includes regions S where the crystal dislocation density is low is formed, thereby manufacturing the group III nitride semiconductor epitaxial substrate 10.

As described above, with respect to the group III nitride semiconductor epitaxial substrate 10 in the present embodiment, the ELO layer 4 having a composition of $Al_xGa_{1-x}N$ ($0<x\leq1$) is formed using the mask pattern 3 composed of carbon. For this reason, in the surface 4a of the ELO layer 4, the regions S where the crystal dislocation density is low are formed. Therefore, the group III nitride semiconductor epitaxial substrate 10 that includes a layer having a composition of $Al_xGa_{1-x}N$ ($0<x\leq1$) with excellent crystal quality can be provided.

In addition, in the method for manufacturing the group III nitride semiconductor epitaxial substrate 10 in the present embodiment, the ELO layer 4 having a composition of $Al_xGa_{1-x}N$ ($0<x\leq1$) is formed using the mask pattern 3 composed of carbon. As a result, even if Al is included in the crystal composition, no polycrystals grow on the mask pattern 3. For this reason, the crystals of the ELO layer 4 grow in the transverse direction (lateral growth) on the mask pattern 3, as a result of which the regions S where the crystal dislocation density is low are formed in the surface 4a of the ELO layer 4. Therefore, a method for manufacturing the group III nitride semiconductor epitaxial substrate 10 that includes a layer having a composition of $Al_xGa_{1-x}N$ (0<x≤1) with excellent crystal quality can be provided.

As described above, according to the group III nitride semiconductor epitaxial substrate 10 and the manufacturing method thereof of the present embodiment, a group III nitride semiconductor epitaxial substrate 10 in which the threading dislocation in the vertical direction is suppressed and the crystal quality is excellent, and a method for manufacturing the same can be provided.

It should be noted that the technical scope of the present invention is not limited to the above-mentioned embodiment, and various modifications can be made without departing from the spirit and scope of the present invention. For example, although the mask pattern 3 is formed on top of the group III nitride layer 2 and the ELO layer 4 is then formed by lamination using this mask pattern 3 in the above-mentioned embodiment, it is also possible to form the mask pattern 3 directly on top of the substrate 1 for growing an epitaxial film by omitting the group III nitride layer 2, followed by the formation of the ELO layer 4 by lamination using this mask pattern 3 (formation of the group III nitride layer 2 may also be omitted in the manufacturing method described in the above embodiment).

In addition, although an example of the group III nitride semiconductor epitaxial substrate 10 in which the mask pattern 3 is still present between the group III nitride layer 2 and the ELO layer 4 is described in the above-mentioned embodiment, the mask pattern 3 may not be still present between the group III nitride layer 2 and the ELO layer 4. Even with these modified embodiments, the same effects of the present invention can be achieved.

EXAMPLES

The present invention will be described below in more detail with reference to a series of Examples. However, the present invention is not limited to these Examples.

Example 1

An AlN epitaxial substrate having a structure as shown in FIG. 1 was manufactured by the method as shown below.
(Group III Nitride Layer Forming Step)

An AlN film to be served as a group III nitride layer was first formed on top of a sapphire substrate. A high-temperature MOCVD apparatus was used for AlN formation. More specifically, a sapphire substrate was mounted on a molybdenum susceptor, and the substrate was set inside a water-cooled reactor made of stainless steel via a load lock chamber. Thereafter, nitrogen gas was caused to flow through for purging inside the reaction furnace.

Next, after replacing the gas flowing through inside the MOCVD furnace with hydrogen gas, the pressure inside the reactor was maintained at 30 torr. The substrate temperature was increased from room temperature to 1,400° C. over 15 minutes using an electrical resistance heater. Subsequently, while retaining the substrate temperature at 1,400° C., hydrogen gas was caused to flow through for 5 minutes thereby subjecting the substrate surface to thermal cleaning.

Then, the substrate temperature was lowered to 1,300° C., and it was confirmed that the substrate temperature was stabilized at 1,300° C. Thereafter, vapor of trimethyl aluminum (TMA) was supplied inside the vapor phase growth reaction furnace for 10 seconds with hydrogen gas serving as a carrier gas. As a result, on top of the sapphire substrate, either aluminum atoms were deposited, or aluminum nitride (AlN) was partially formed due to the reaction between the aluminum atoms and the nitrogen atoms generated by decomposition of the deposits, which had remained inside the vapor phase growth reaction furnace. In any case, nitridation of the sapphire substrate was suppressed.

Subsequently, ammonia ($NH_3$) gas was supplied into the vapor phase growth reaction furnace so as to achieve the (group V element)/(group III element) ratio of 500, thereby growing an AlN film for 10 minutes. Thereafter, ammonia ($NH_3$) gas and trimethyl aluminum (TMA) were adjusted so as to achieve the (group V element)/(group III element) ratio of 100, thereby further growing an AlN film for 40 minutes. During the growth of the AlN film, the temperature was monitored through the reflectance of the epitaxial layer and the susceptor temperature using an in situ observation apparatus. In addition, from the reflectance measurement, it was confirmed that the film thickness of the AlN layer was 2 µm in total.

Finally, supply of trimethyl aluminum (TMA) was stopped and the temperature of the substrate was cooled to 300° C., and after stopping the supply of ammonia, the temperature of the substrate was further cooled to room temperature. Then, the air inside the vapor phase growth reaction furnace was replaced with nitrogen, and a wafer mounted on the susceptor was taken out via the load lock chamber.
(Mask Pattern Forming Step)

Next, a mask pattern composed of carbon was formed on the surface of the substrate on which the AlN layer had been formed. A sputtering apparatus was used for depositing carbon. More specifically, a carbon film was formed all over the surface of the substrate on which the AlN layer had been formed, by sputtering using the following film forming conditions. Then, a striped resist pattern with several micrometers of intervals was formed by photolithography. Then, the wafer was subjected to oxygen ashing, thereby oxidizing and removing the portion where the carbon film was exposed. Thereafter, a carbon film having a stripe structure was formed on top of the AlN layer by removing the resist pattern.
[Sputtering Conditions]

Target: highly pure graphite
Deposition temperature: room temperature
Deposition rate: 40 to 50 nm/hr
Film thickness: 200 nm
(ELO Layer Forming Step)

Finally, an AlN to be served as an ELO layer was formed on top of the wafer in which a carbon film having a stripe structure had been formed. As in the case of forming a group III nitride layer, a high-temperature MOCVD apparatus was used for forming the AlN film. More specifically, the substrate in which a carbon film having a stripe structure had been formed was mounted on a molybdenum susceptor, and the substrate was set inside a water-cooled reactor made of stainless steel via a load lock chamber. Thereafter, nitrogen gas was caused to flow through for purging inside the reaction furnace.

Next, after replacing the gas flowing through inside the MOCVD furnace with hydrogen gas, the pressure inside the reactor was maintained at 30 torr. The substrate temperature was increased from room temperature to 1,400° C. over 15 minutes using an electrical resistance heater. Subsequently, while retaining the substrate temperature at 1,400° C., hydrogen gas was caused to flow through for 5 minutes, thereby subjecting the substrate surface to thermal cleaning.

Then, the substrate temperature was lowered to 1,300° C., and it was confirmed that the substrate temperature was stabilized at 1,300° C. Thereafter, ammonia gas and trimethyl aluminum were supplied simultaneously to the vapor phase growth reaction furnace to start the AlN deposition. Here, ammonia gas and trimethyl aluminum were adjusted in advance so as to achieve the (group V element)/(group III element) ratio of 100. In this manner, an AlN film was grown to a film thickness of about 10 μm over 3 to 4 hours.

Finally, supply of trimethyl aluminum (TMA) was stopped and the temperature of the substrate was cooled to 300° C., and after stopping the supply of ammonia, the temperature of the substrate was further cooled to room temperature. Then, the air inside the vapor phase growth reaction furnace was replaced with nitrogen, and a wafer mounted on the susceptor was taken out via the load lock chamber. In this manner, an AlN epitaxial substrate in which the threading dislocation in the vertical direction was suppressed and the crystal quality was excellent could be manufactured.

INDUSTRIAL APPLICABILITY

The present invention can be widely applied for improving the crystal quality of group III nitride semiconductor layers that include Al. Furthermore, the present invention can also be widely applied when forming a light emitting layer, such as a light emitting diode, for light in the ultraviolet or deep ultraviolet region.

The invention claimed is:

1. A group III nitride semiconductor epitaxial substrate comprising:
   a sapphire substrate for growing an epitaxial film; and
   an ELO layer having a composition of $Al_xGa_{1-x}N$ ($0<x\leq1$) formed on top of the substrate, without forming a group III nitride layer
   wherein the ELO layer is a layer formed by using a mask pattern so as to prevent formation of polycrystalline growth on the mask pattern, which mask pattern is composed of carbon and is formed directly on top of the substrate, and the mask pattern reacts under a high temperature ranging from 1250° C. to 1400° C. with $H_2$ serving as a carrier gas or an ammonium $NH_3$ contained in the raw material as a nitrogen source to be eliminated such that the carbon base mask may be present between the substrate and the ELO layer.

2. The group III nitride semiconductor epitaxial substrate according to claim 1, wherein the thickness of the mask pattern is within the range from 10 nm to 200 nm.

3. The group III nitride semiconductor epitaxial substrate according to claim 1, wherein the thickness of the ELO layer is within the range from 2 μm to 50 μm.

4. A method for manufacturing a group III nitride semiconductor epitaxial substrate comprising:
   a step for forming a mask pattern composed of carbon directly on top of a sapphire substrate for growing an epitaxial film; and
   a step for forming an ELO layer having a composition of $Al_xGa_{1-x}N$ ($0\leq x\leq1$) by using the mask pattern, while preventing the formation of polycrystalline growth on the mask pattern, such that the mask pattern reacts under a high temperature ranging from 1250° C. to 1400° C. with $H_2$ serving as a carrier gas or an ammonium $NH_3$ contained in the raw material as nitrogen source to be eliminated, such that the carbon base mask may be completely eliminated between the substrate and the ELO layer.

5. The method for manufacturing a group III nitride semiconductor epitaxial substrate according to claim 4, wherein the film growth rate of the ELO layer 4 is 0.1 μm/hr or higher.

6. A method for manufacturing a group III nitride semiconductor epitaxial substrate comprising:
   a step for forming a mask pattern composed of carbon directly on top of a sapphire substrate for growing an epitaxial film; and
   a step for forming an ELO layer having a composition of $Al_xGa_{1-x}N$ ($0<x\leq1$) by using the mask pattern, while preventing the formation of polycrystalline growth on the mask pattern, such that the mask pattern reacts under a high temperature ranging from 1250° C. to 1400° C. with $H_2$ serving as a carrier gas or an ammonium $NH_3$ contained in the raw material as a nitrogen source to be eliminated, such that the carbon base mask may be present between the substrate and the ELO layer.

7. The method for manufacturing a group III nitride semiconductor epitaxial substrate according to claim 6, wherein the film growth rate of the ELO layer 4 is 0.1 μm/hr or higher.

* * * * *